(12) United States Patent
Cheng et al.

(10) Patent No.: US 9,583,610 B2
(45) Date of Patent: Feb. 28, 2017

(54) TRANSISTOR AND METHOD OF MANUFACTURING THE SAME

(71) Applicant: TAIWAN SEMICONDUCTOR MANUFACTURING COMPANY, LTD., Hsinchu (TW)

(72) Inventors: Chih-Chang Cheng, Hsinchu (TW); Fu-Yu Chu, Hsinchu (TW); Ruey-Hsin Liu, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/868,979

(22) Filed: Sep. 29, 2015

(65) Prior Publication Data
US 2016/0020321 A1    Jan. 21, 2016

Related U.S. Application Data

(63) Continuation of application No. 14/322,094, filed on Jul. 2, 2014, now Pat. No. 9,159,827, which is a
(Continued)

(51) Int. Cl.
*H01L 21/336* (2006.01)
*H01L 29/78* (2006.01)
(Continued)

(52) U.S. Cl.
CPC ........ *H01L 29/7809* (2013.01); *H01L 21/265* (2013.01); *H01L 21/2815* (2013.01); *H01L 29/0696* (2013.01); *H01L 29/407* (2013.01); *H01L 29/41741* (2013.01); *H01L 29/4236* (2013.01); *H01L 29/42364* (2013.01); *H01L 29/66666* (2013.01); *H01L 29/66734* (2013.01); *H01L 29/7813* (2013.01); *H01L 29/7827* (2013.01); *H01L 29/0878* (2013.01);
(Continued)

(58) Field of Classification Search
CPC ........................ H01L 29/7809; H01L 29/7813
See application file for complete search history.

(56) References Cited

U.S. PATENT DOCUMENTS

| | | | |
|---|---|---|---|
| 6,316,807 B1 | 11/2001 | Fujishima et al. | |
| 7,646,062 B2 * | 1/2010 | Yamaoka | H01L 29/66553 257/207 |

OTHER PUBLICATIONS

Fujishima, Naoto et al., "A Trench Lateral Power MOSFET Using Self-Aligned Trench Bottom Contact Holes", 1997, IEEE, 14.3.1-14.34.
(Continued)

*Primary Examiner* — Daniel Shook
(74) *Attorney, Agent, or Firm* — Hauptman Ham, LLP

(57) ABSTRACT

A method of forming a manufacture includes forming a trench in a doped layer; and forming a gate dielectric layer along sidewalls of an upper portion of the trench. The method further includes forming a first conductive feature along sidewalls of the gate dielectric layer, wherein the first conductive feature has a first depth in the trench. The method further includes forming an insulating layer covering the first conductive feature and the first insulating layer. The method further includes forming a second conductive feature along sidewalls of the second insulating layer, wherein the second conductive feature has a second depth in the trench different from the first depth.

20 Claims, 12 Drawing Sheets

Related U.S. Application Data continuation of application No. 13/420,248, filed on Mar. 14, 2012, now Pat. No. 8,796,760.

(51) Int. Cl.
| | | |
|---|---|---|
| *H01L 21/28* | (2006.01) | |
| *H01L 29/40* | (2006.01) | |
| *H01L 29/66* | (2006.01) | |
| *H01L 21/265* | (2006.01) | |
| *H01L 29/06* | (2006.01) | |
| H01L 29/417 | (2006.01) | |
| H01L 29/423 | (2006.01) | |
| H01L 29/08 | (2006.01) | |

(52) U.S. Cl.
CPC .. *H01L 29/41766* (2013.01); *H01L 29/42368* (2013.01); *H01L 29/42376* (2013.01)

(56) References Cited

OTHER PUBLICATIONS

Moens, P., et al., "XtreMOSTM: The First Integrated Power Transistor Breaking the Silicon Limit", IEDM 2006, pp. 1-4.
Office Action dated Jul. 24, 2014 from corresponding No. TW 101148237.

\* cited by examiner

TRANSISTOR AND METHOD OF MANUFACTURING THE SAME

PRIORITY CLAIM

The present application is a continuation of U.S. application Ser. No. 14/322,094, filed Jul. 2, 2014, which is a continuation of U.S. application Ser. No. 13/420,248, filed Mar. 14, 2012, now U.S. Pat. No. 8,796,760, issued Aug. 5, 2014, the disclosures of which are incorporated herein by reference in their entireties.

BACKGROUND

Many metal-oxide-semiconductor field-effect transistors (MOS FETs) for high voltage applications have a vertical structure. The term "vertical structure" or sometimes referred to as "a vertical MOS transistor" refers to the arrangement that the source terminal and the drain terminal of the vertical MOS transistor are positioned one over another. In contrast, "a planar MOS transistor" refers to the arrangement of a transistor that the source terminal and the drain terminal of the planar MOS transistor are positioned at substantially the same horizontal planar level. Compared with a planar MOS transistor occupying the same area in a semiconductor integrated circuit (IC) chip, a vertical MOS transistor is usable of withstanding a greater drain-to-source voltage difference and a greater current level and is configurable to have low turned-on drain-to-source resistance.

DESCRIPTION OF THE DRAWINGS

One or more embodiments are illustrated by way of examples, and not by limitation, in the figures of the accompanying drawings, wherein elements having the same reference numeral designations represent like elements throughout and wherein.

DETAILED DESCRIPTION

Figure 1A:
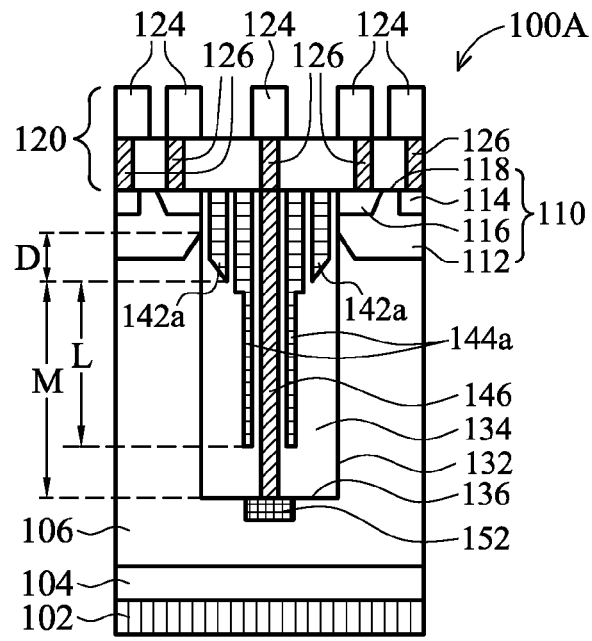
FIGS. 1A-1C are cross-sectional views of various vertical transistor cells in accordance with one or more embodiments.

It is understood that the following disclosure provides many different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

The formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1A is a cross-sectional view of a vertical transistor cell 100A in accordance with one or more embodiments. The vertical transistor cell 100A has a substrate 102, a buried doped layer 104 over the substrate 102, a doped layer 106 over the buried doped layer 104, at least one body structure 110 over the doped layer 106, and an interconnection structure 120 over the at least one body structure 110 and the doped layer 106. The vertical transistor cell 100A also has a trench 132 defined in the doped layer 106, an insulator 134 partially filling the trench 132, and a plurality of conductive features 142a, 144a, and 146 buried in the insulator 134.

The body structure 110 has a body region 112, a body contact region 114, and a source region 116. In some embodiments, the doped layer 106 has a first type doping and the body region 112 has a second type doping different from the first type doping. In some embodiments, the body contact region 114 has the second type doping, and conductivity of the body contact region 114 is greater than that of the body region 112. In some embodiments, the source region 116 has the first type doping. In at least one embodiment, the buried doped layer 104 has the first type doping, and conductivity of the buried doped layer 104 is higher than that of the doped layer 106. In some embodiments, the buried doped layer 104 is omitted.

In some embodiments, the first type doping is an N-type doping, and the second type doping is a P-type doping. In some embodiments, the N-type doping refers to making electrons as majority charge carriers in a semiconductor material, and the P-type doping refers to making holes as majority charge carriers in a semiconductor material.

The body structure 110 has an upper surface 118, and the trench 132 has a bottom surface 136. The vertical transistor cell 100A has a first conductive feature 142a buried in, and separated from the doped layer 106 and the body structure 110 by, the insulator 134. The first conductive feature 142a extends from a position substantially leveled with the upper surface 118 of the body structure 110 toward the bottom surface 136 of the trench 132. The first conductive feature 142a has a lower end 148a and overlaps the doped layer 106 for a predetermined overlapping distance D. In some embodiments, the overlapping distance D ranges from 0 to 2 μm.

In some embodiments, by decreasing the overlapping distance D, the parasitic capacitance between the first conductive feature 142a and the doped layer 106 is reduced, and thus the operation speed of the vertical transistor cell 100A is increased and the switching loss of the vertical transistor cell 100A is decreased.

The vertical transistor cell 100A has a second conductive feature 144a buried in, and separated from the first conductive feature 142a by, the insulator 134. The second conductive feature 144a extends from a position substantially leveled with the upper surface 118 of the body structure 110 toward the bottom surface 136 of the trench 132. The second conductive feature 144a has an extended portion not overlapping the first conductive feature 142a, and the extended portion has an extended length L. In some embodiments, the extended length L ranges from 50% to 95% a distance from the lower end 148a of the first conductive feature 142a to the bottom surface 136 of the trench 132. In at least one embodiment, the first conductive feature 142a has two conductive members symmetrically arranged about the second conductive feature 144a.

The vertical transistor cell 100A further has a third conductive feature 146 buried in, and separated from the second conductive feature 144a by, the insulator 134. The third conductive feature 146 extends from a position substantially leveled with the upper surface 118 of the body structure 110 to the bottom surface 136 of the trench 132 and in contact with the bottom surface 136 of the trench 132. The doped layer 106 has a contact region 152 positioned along the bottom surface 136 and in contact with the third conductive feature 146. In at least one embodiment, the second conductive feature 144a has two conductive members symmetrically arranged about the third conductive feature 146.

The interconnection structure 120 includes a dielectric layer 122 over the doped layer 106 and the body structure 110, a plurality of interconnection structures 122 over the dielectric layer 122, and a plurality of via plugs 126 in the dielectric layer 122 and electrically connecting the third conductive feature 146, the body contact region 114, and the source region 116 with the plurality of interconnection structures 122.

Figures 1B, 1C:
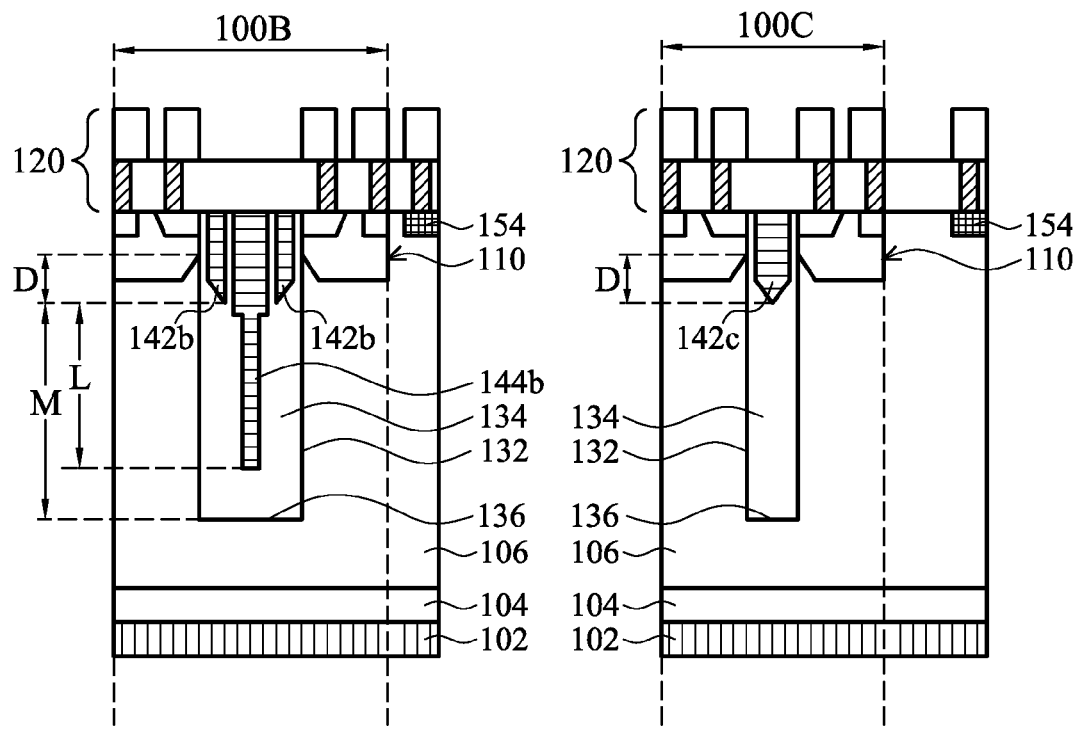

FIG. 1B is a cross-sectional view of a vertical transistor cell 100B in accordance with one or more embodiments. Compared with the vertical transistor cell 100A in FIG. 1A, the third conductive feature 146 and the contact region 152 are omitted, and the second conductive feature 144a in FIG. 1A is rearranged to have only one conductive member, such as the second conductive feature 144b depicted in FIG. 1B. In at least one embodiment, the vertical transistor cell 100B also has a contact region 154 in the doped layer 106 for electrically connecting the doped layer 106 with the interconnection structure 120.

The first conductive feature 142b has a lower end 148b and overlaps the doped layer 106 for an overlapping distance D. In some embodiments, the overlapping distance D ranges from 0 to 2 μm. The second conductive feature 144a has an extended portion not overlapping the first conductive feature 142b, and the extended portion has an extended length L. In some embodiments, the extended length L ranges from 50% to 95% a distance from the lower end 148b of the first conductive feature 142b to the bottom surface 136 of the trench 132. In at least one embodiment, the first conductive feature 142b has two conductive members symmetrically arranged about the second conductive feature 144b.

Other features of the vertical transistor cell 100B that are similar to those of the vertical transistor cell 100A are omitted and not repeated in the disclosure.

FIG. 1C is a cross-sectional view of a vertical transistor cell 100C in accordance with one or more embodiments. Compared with the vertical transistor cell 100B in FIG. 1B, the second conductive feature 144b is further omitted, and the first conductive feature 142a in FIG. 1B is rearranged to have only one conductive member, such as the first conductive feature 142c depicted in FIG. 1C. The first conductive feature 142c overlaps the doped layer 106 for an overlapping distance D. In some embodiments, the overlapping distance D ranges from 0 to 2 μm.

Other features of the vertical transistor cell 100C that are similar to those of the vertical transistor cell 100A and/or the vertical transistor cell 100B are omitted and not repeated in the disclosure.

As depicted in FIGS. 1A-1C, in some embodiments, the substrate 102 includes: an elementary semiconductor such as silicon or germanium in crystal, polycrystalline, or an amorphous structure; a compound semiconductor including silicon carbide, gallium arsenide, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. In at least one embodiment, the substrate 102 is an alloy semiconductor substrate having a gradient SiGe feature in which the Si and Ge composition change from one ratio at one location to another ratio at another location of the gradient SiGe feature. In another embodiment, the alloy SiGe is formed over a silicon substrate. In yet another embodiment, a SiGe substrate is strained. In some further embodiments, the semiconductor substrate 102 is a semiconductor on insulator. In some examples, the semiconductor substrate 102 includes an epitaxial layer or a buried layer. In other examples, the compound semiconductor substrate has a multilayer structure, or the substrate includes a multilayer compound semiconductor structure.

In some embodiments, the doped layer 106 is an epitaxial layer. In some embodiments, the insulator 134 has a material including silicon oxide, silicon nitride, or other dielectric materials. In some embodiments, the first conductive feature 142a, 142b, and 142c, the second conductive feature 144a and 144b, and the third conductive feature 146 individually have a material including polycrystalline silicon, copper, aluminum, copper-aluminum alloy, tungsten, or other conductive materials.

In at least one embodiment, the vertical transistor cells 100A, 100B, and 100C form transistor devices individually. In some embodiments, one or more vertical transistor cells 100A, 100B, and 100C collectively form a single transistor device. In some embodiments, the first conductive feature 142a, 142b, or 142c is usable as gate electrodes, the second conductive feature 144a or 144b is usable as source electrodes, and the third conductive feature 146 is usable as a drain electrode.

In some embodiments, the first conductive feature 142a, 142b, or 142c is separated from the body structure 110 sufficient to withstand a predetermined gate-to-source breakdown voltage and a predetermined gate-to-drain breakdown voltage. In some embodiments, a minimum distance between the first conductive feature 142a, 142b, or 142c and the body structure 110 ranges from 5 nm to 100 nm.

In some embodiments, the second conductive feature 144a or 144b is separated from the first conductive feature 142a, 142b, or 142c sufficient to withstand the predetermined gate-to-drain breakdown voltage. In some embodiments, a minimum distance between the second conductive feature 144a or 144b and the first conductive feature 142a, 142b, or 142c ranges from 10 nm to 150 nm.

In some embodiments, the extended length L of the extended portion of the second conductive feature 144a or 144b is determined according to a predetermined drain-to-source breakdown voltage. In at least one embodiment, the extended length L is proportional to the predetermined drain-to-source breakdown voltage. In some embodiments, the second conductive feature 144a or 144b is separated from the third conductive feature 146 sufficient to withstand the predetermined drain-to-source breakdown voltage. In some embodiments, a minimum distance between the second conductive feature 144a or 144b and the third conductive feature 146 ranges from 50 nm to 300 nm.

Figure 2:
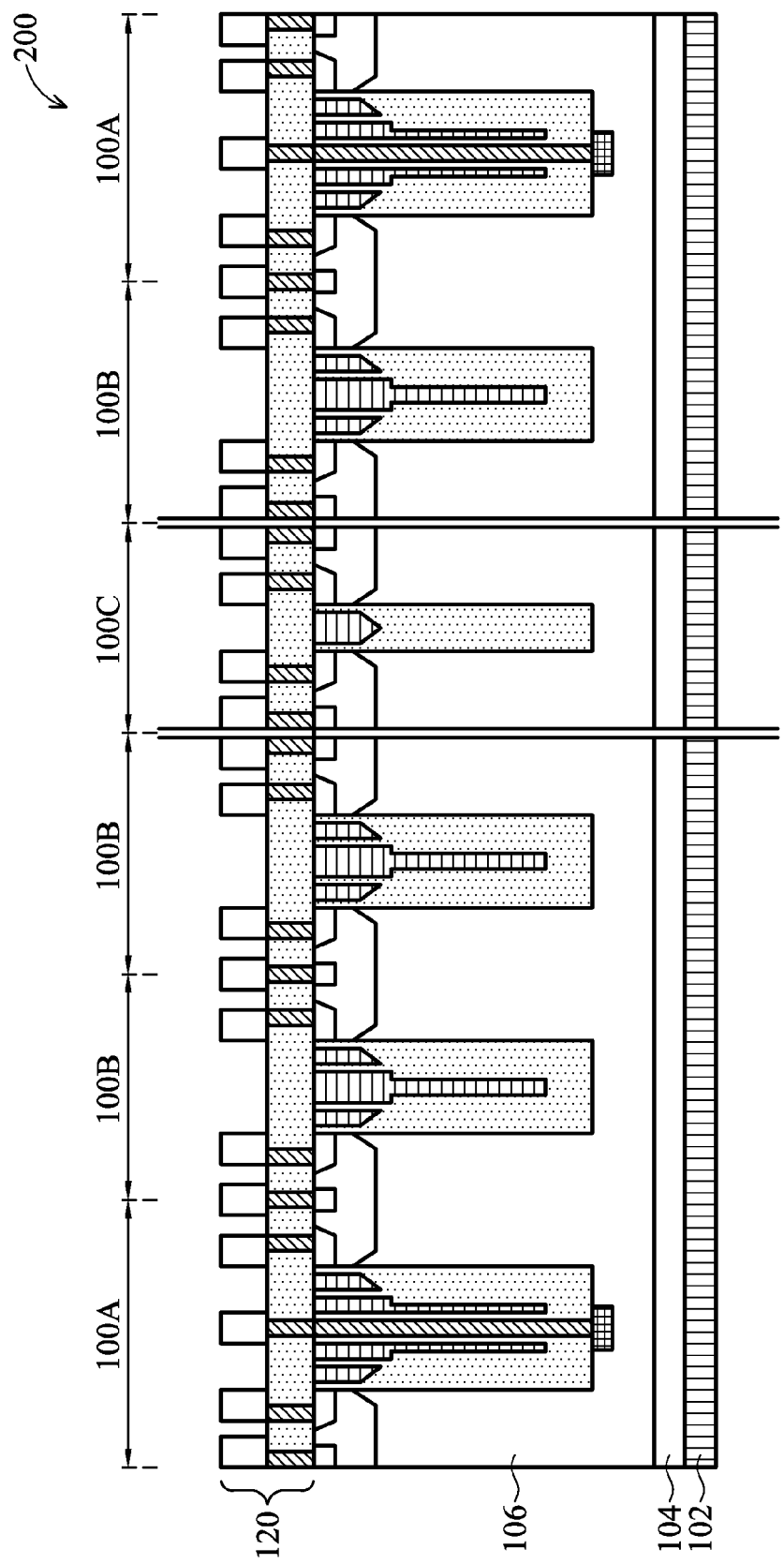
FIG. 2 is a cross-sectional view of a vertical transistor in accordance with one or more embodiments.

FIG. 2 is a cross-sectional view of one vertical transistor 200 in accordance with one or more embodiments. The vertical transistor 200 has two or more vertical transistor cells 100A as depicted in FIG. 1A, three or more vertical transistor cells 100B as depicted in FIG. 1B, and one or more vertical transistor cells 100C as depicted in FIG. 1C. In some embodiments, the vertical transistor 200 has any number of any types of the vertical transistor cells 100A, 100B, and 100C. In some embodiments, the vertical transistor 200 has two vertical transistor cells 100A sandwiching one or more vertical transistor cells 100B. In some embodiments, the vertical transistor 200 has two vertical transistor cells 100A sandwiching two or more vertical transistor cells 100B, which further sandwiching one or more vertical transistor cells 100C. In at least one embodiment, the vertical transistor 200 has at least one vertical transistor cell 100A and one vertical transistor cell 100B. In yet another embodiment, the vertical transistor 200 has at least one vertical transistor cell 100A, one vertical transistor cell 100B, and one vertical transistor cell 100C.

In at least one embodiments, all the corresponding first conductive features of the vertical transistor cells 100A, 100B, and 100C are electrically coupled together, all the corresponding second conductive features of the vertical transistor cells 100A and 100B are electrically coupled together, and all the corresponding third conductive features of the vertical transistor cells 100A and the doped layer 106 are electrically coupled together.

Detailed features of the vertical transistor cells 100A, 100B, and 100C are omitted and not repeated in the disclosure.

Figure 3:
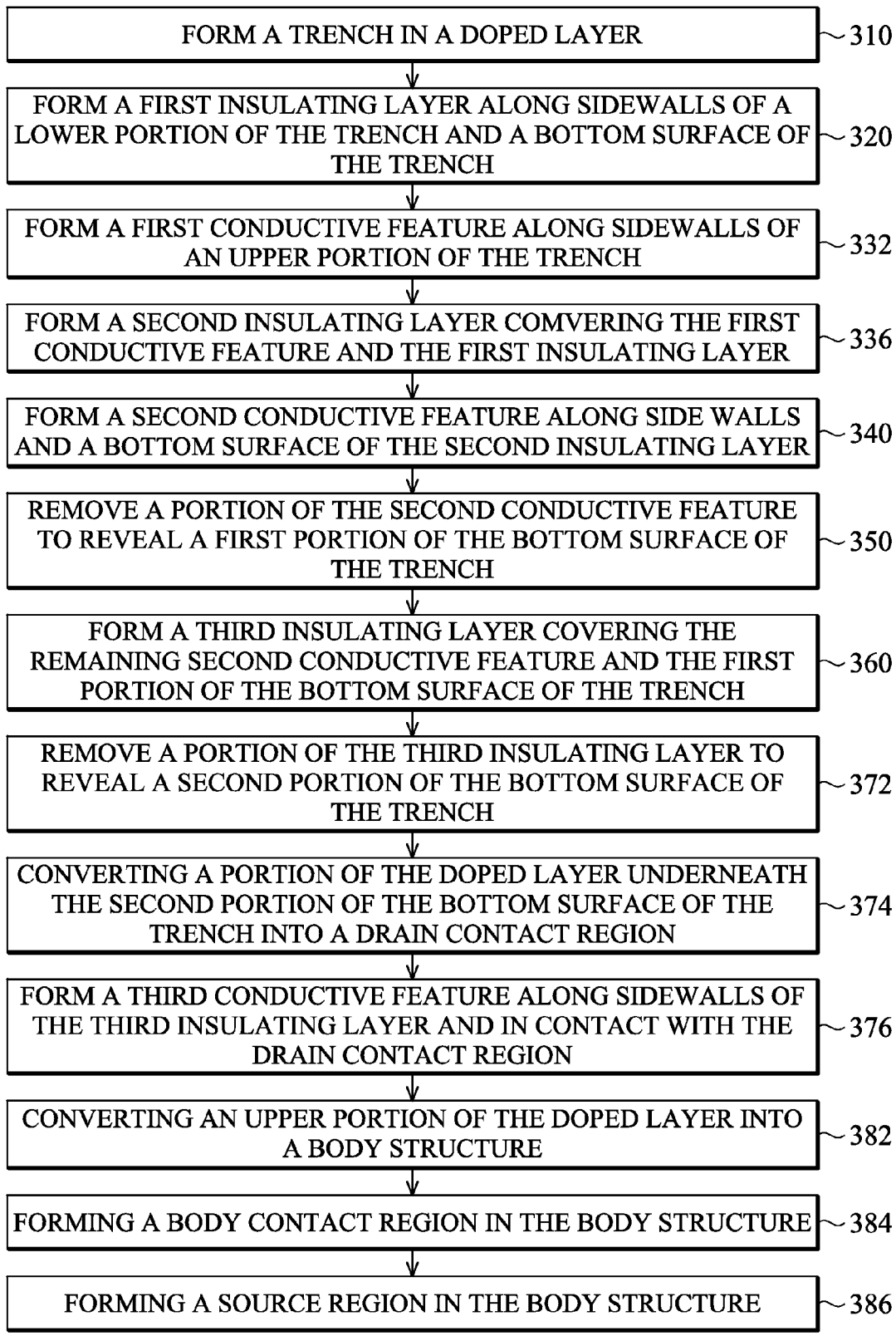
FIG. 3 is a flow chart of a method of making a vertical transistor in accordance with one or more embodiments.

FIG. 3 is a flow chart of a method 300 of making a vertical transistor (such as the vertical transistor 200 in FIG. 2 and FIG. 4) in accordance with one or more embodiments. FIGS. 4A-4I are cross-sectional views of the vertical transistor 200 at various manufacturing stages in accordance with one or more embodiments. It is understood that additional processes may be performed before, during, and/or after the method 300 depicted in FIG. 3, and that some other processes may only be briefly described herein.

FIGS. 3 and 4A-4I are also usable for illustrating the formation of one or more vertical transistor cells (such as the vertical transistor cell 100A, 100B, or 100C in FIG. 1A, 1B, or 1C). In the present disclosure, the method 300 is illustrated based on a single vertical transistor cell 100A, 100B, or 100C, and terms are sometimes used in their singular forms. However, the illustrations of a single vertical transistor cell 100A, 100B, or 100C is applicable to other vertical transistor cell 100A, 100B, or 100C in the vertical transistor 200.

Figure 4A:
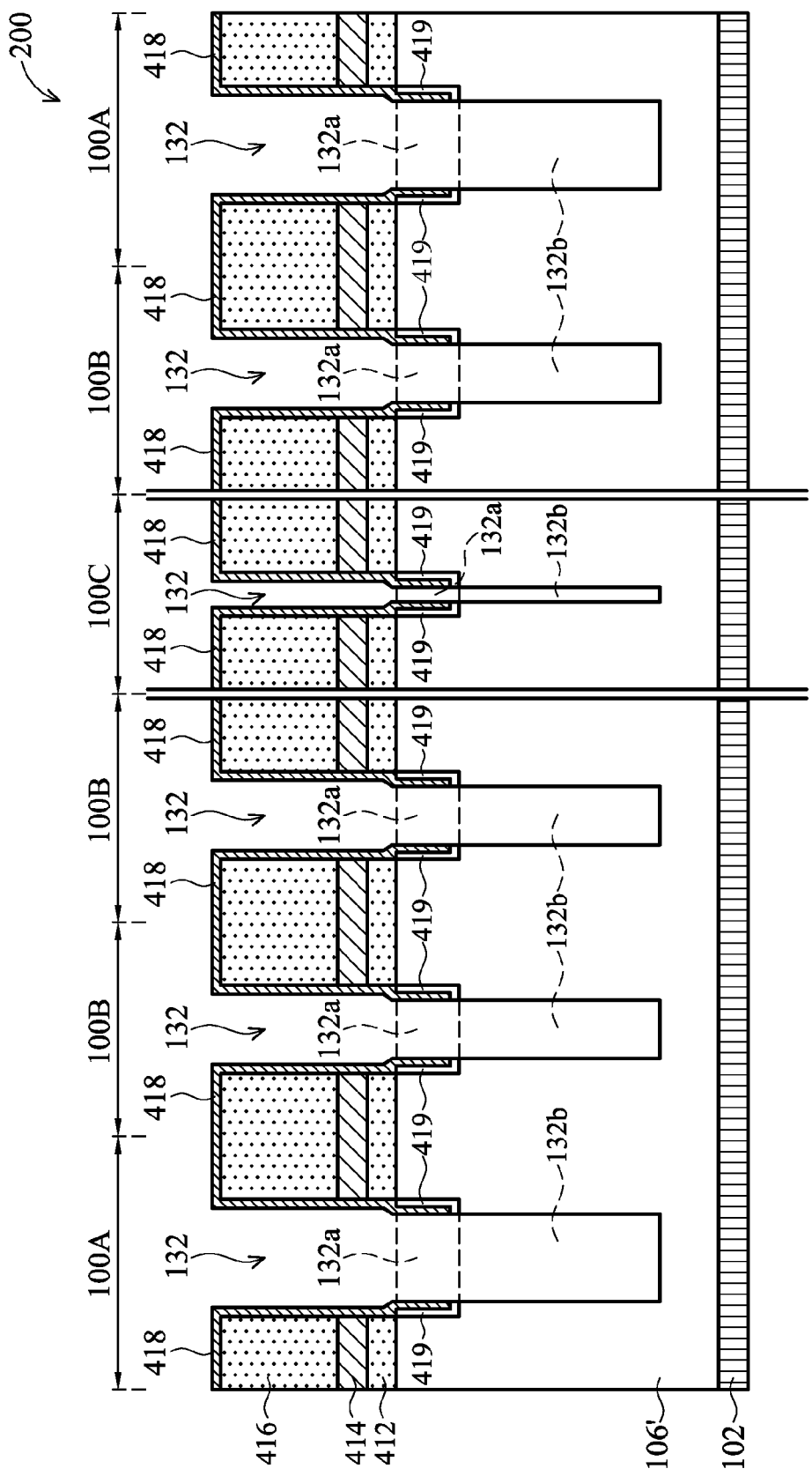
FIGS. 4A-4I are cross-sectional views of a vertical transistor at various manufacturing stages in accordance with one or more embodiments.

As depicted in FIG. 3 and FIG. 4A, in operation 310, for each vertical transistor cell 100A, 100B, or 100C, a trench 132 is formed in a doped layer 106'. The doped layer 106' is an epitaxial layer over a substrate 102. The trench 132 has an upper portion 132a and a lower portion 132b. A width of the upper portion 132a is greater than that of the lower portion 132b. A first silicon dioxide layer 412, a first silicon nitride layer 414, and a second silicon dioxide layer 416 are stacked one over another over the doped layer 106'. A third silicon dioxide layer 419 is on sidewalls of the upper portion 132a of the trench 132, and a second silicon nitride layer 418 is over the second silicon dioxide layer 416 and on sidewalls of the second silicon dioxide layer 416 and the third silicon dioxide layer 419. In some embodiments, one or more of the first silicon dioxide layer 412, the first silicon nitride layer 414, the second silicon dioxide layer 416, and the third silicon dioxide layer 419 are omitted.

In some embodiments, the formation of the trench 132 includes first forming the upper portion 132a of the trench 132 by selectively removing a portion of the doped layer 106'. Then, the third silicon dioxide layer 419 is formed on the sidewalls of the upper portion 132a, and the second silicon nitride layer 418 is formed on the sidewalls of the third silicon dioxide layer 419. The doped layer 106' is further partially removed to form the lower portion 132b of the trench 132.

In some embodiments, the upper portion 132a of the trench 132 is formed by performing a silicon dry etching process using a patterned version of the stack of the first silicon dioxide layer 412, the first silicon nitride layer 414, and the second silicon dioxide layer 416 as a mask. In some embodiments, the lower portion 132b of the trench 132 is formed by performing a silicon dry etching process using the second silicon nitride layer 418 as a mask.

In some embodiments, the third silicon dioxide layer 419 has a thickness ranging from 5 nm to 25 nm. In some embodiments, the third silicon dioxide layer 419 is formed by performing a field oxidation (FOX) pad oxide growth process.

In some embodiments, the width of the upper portion 132a for a vertical transistor cell 100A ranges from 1.5 µm to 1.9 µm. In some embodiments, the width of the upper portion 132a for a vertical transistor cell 100B ranges from 0.8 µm to 1.2 µm. In some embodiments, the width of the upper portion 132a for a vertical transistor cell 100C ranges from 0.4 µm to 0.6 µm. In some embodiments, the upper portions 132a of two adjacent trenches 132 are separated for a distance ranging from 0.2 µm to 5 µm.

Figure 4B:
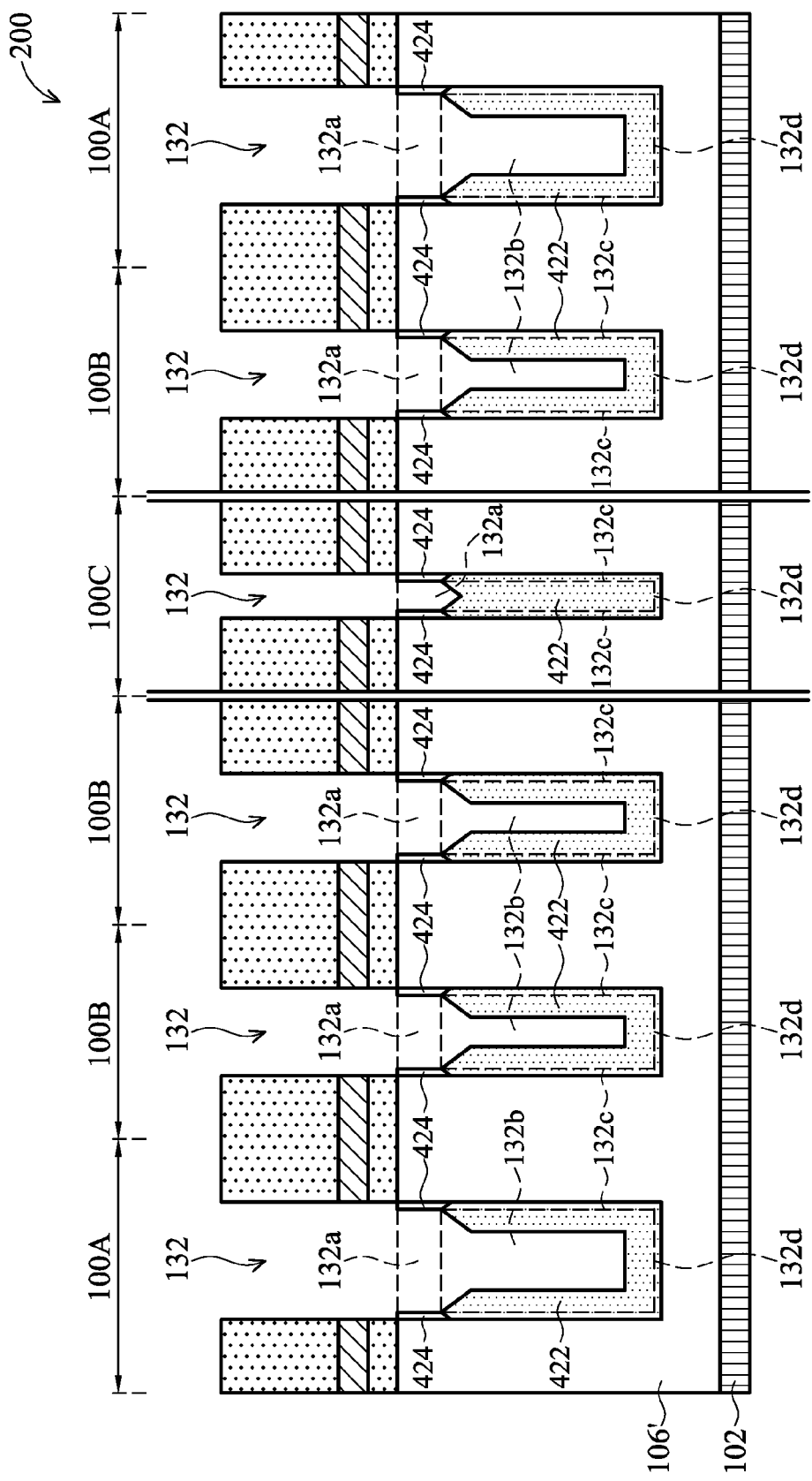

As depicted in FIG. 3 and FIG. 4B, in operation 320, a first insulating layer 422 is formed along sidewalls 132c of the lower portion 132b of the trench 132 and a bottom surface 132d of the trench 132. In at least one embodiment for forming a vertical transistor cell 100C, the first insulating layer 422 fully fills the lower portion 132b of the trench 132 for forming the vertical transistor cell 100C.

In some embodiments, the first insulating layer 422 comprises a material including silicon dioxide. In at least one embodiment, the first insulating layer 422 is formed by performing a FOX growth process, and the first insulating layer 422 grows beyond the original boundary of the sidewalls 132c and the bottom surface 132d of the trench 132. In some embodiments, the first insulating layer 422 has a thickness ranging from 200 nm to 600 nm. In some embodiments, the first insulating layer 422 has a tapered shape at the boundary between the first insulating layer 422 and the third silicon dioxide layer 419. The tapered shape region is formed as a result of the FOX growth process and also known as "bird beak regions."

After the formation of the first insulating layer 422, the second silicon nitride layer 418 is removed by performing a wet etching process. Then, the third silicon dioxide layer 419 is removed, and a gate dielectric structure 424 is formed on the sidewalls 132c of the upper portion 132a of the trench 132.

In some embodiments, the gate dielectric structure 424 is usable for separating the first conductive feature 142a (FIG. 1A, 1B, or 1C) from the doped layer 106 (FIG. 1A, 1B, or 1C) and the body structure 110 (FIG. 1A, 1B, or 1C). In some embodiments, the gate dielectric structure 424 has a thickness ranging from 5 nm to 100 nm. In some embodiments, the gate dielectric structure 424 is formed by performing a gate oxide growth process.

Figure 4C:
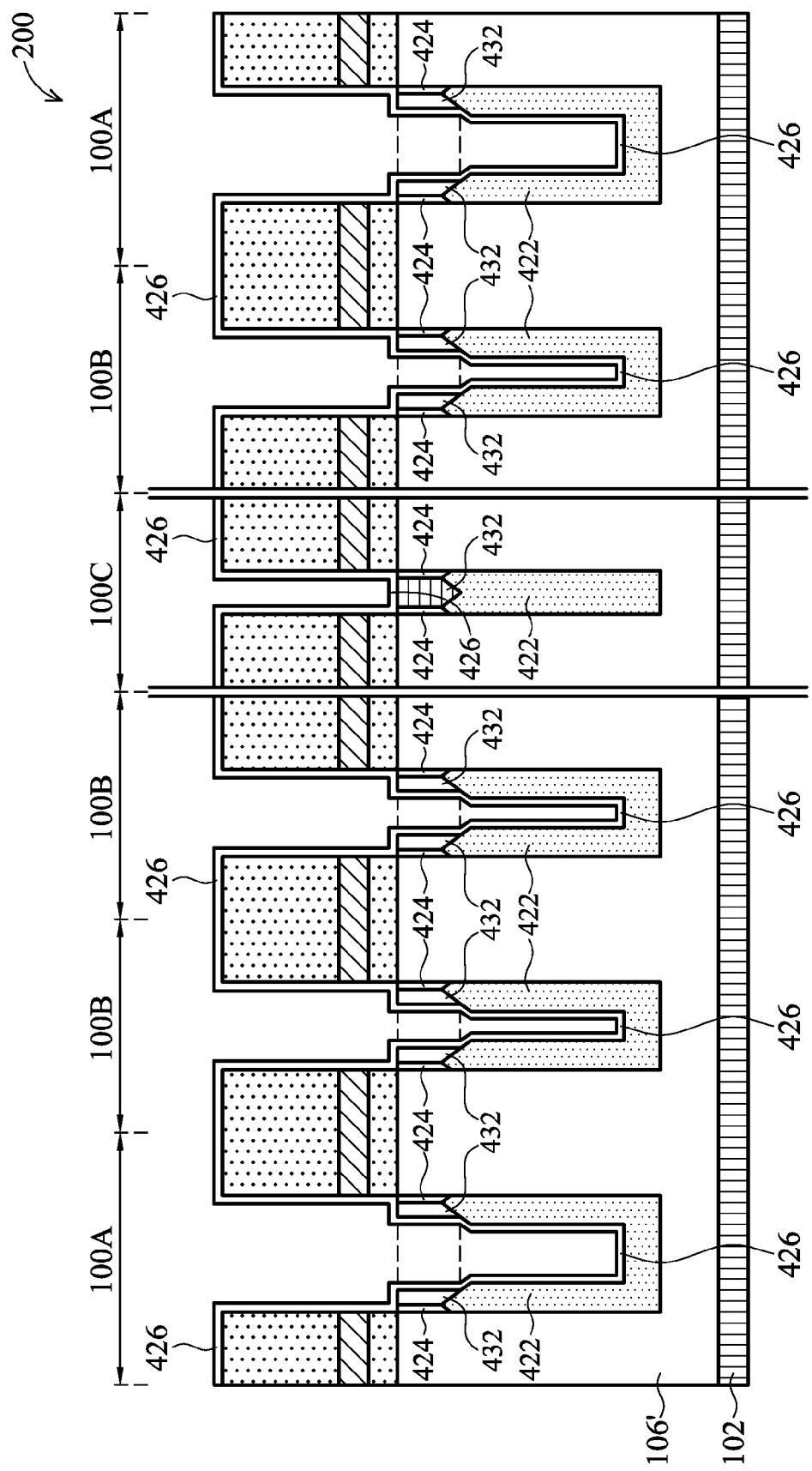

As depicted in FIG. 3 and FIG. 4C, in operation 332, a first conductive feature 432 is formed along sidewalls of the gate dielectric structure 424. In some embodiments, the first conductive feature 432 has two conductive members. In at least one embodiment for forming the vertical transistor cell 100C, the first conductive feature 432 has one conductive member fully fills the upper portion 132a of the trench 132 for forming the vertical transistor cell 100C.

In some embodiments, the first conductive feature 432 has a material including polycrystalline silicon, copper, aluminum, copper-aluminum alloy, tungsten, or other conductive materials. In some embodiments, the formation of the first conductive feature 432 includes filling the trench 132 by polycrystalline silicon, and then selectively remove a portion of the filled-in polycrystalline silicon by performing a polycrystalline silicon dry etching process to form the first conductive feature 432.

As depicted in FIG. 3 and FIG. 4C, in operation 336, a second insulating layer 426 is formed to cover the first conductive feature 432 and the first insulating layer 422. In some embodiments, the second insulating layer 426 is formed by performing a silicon dioxide deposition process. In some embodiments, the second insulating layer 426 has a thickness ranging from 10 nm to 150 nm.

In at least one embodiment for forming the vertical transistor 100B, a bottom portion of the second insulating layer 426 has a thickness greater than 35 nm. The thickness of bottom portion of the second insulating layer 426 is set according to a predetermined extended length L (FIG. 1A or 1B) of the to-be formed second conductive feature 434 (FIG. 4D and the second conductive features 144a or 144b in FIG. 1A or 1B).

In at least one embodiment of forming the vertical transistor cell 100C, the second insulating layer 426 covers an upper surface of the first conductive feature 432 for the vertical transistor cell 100C.

Figure 4D:
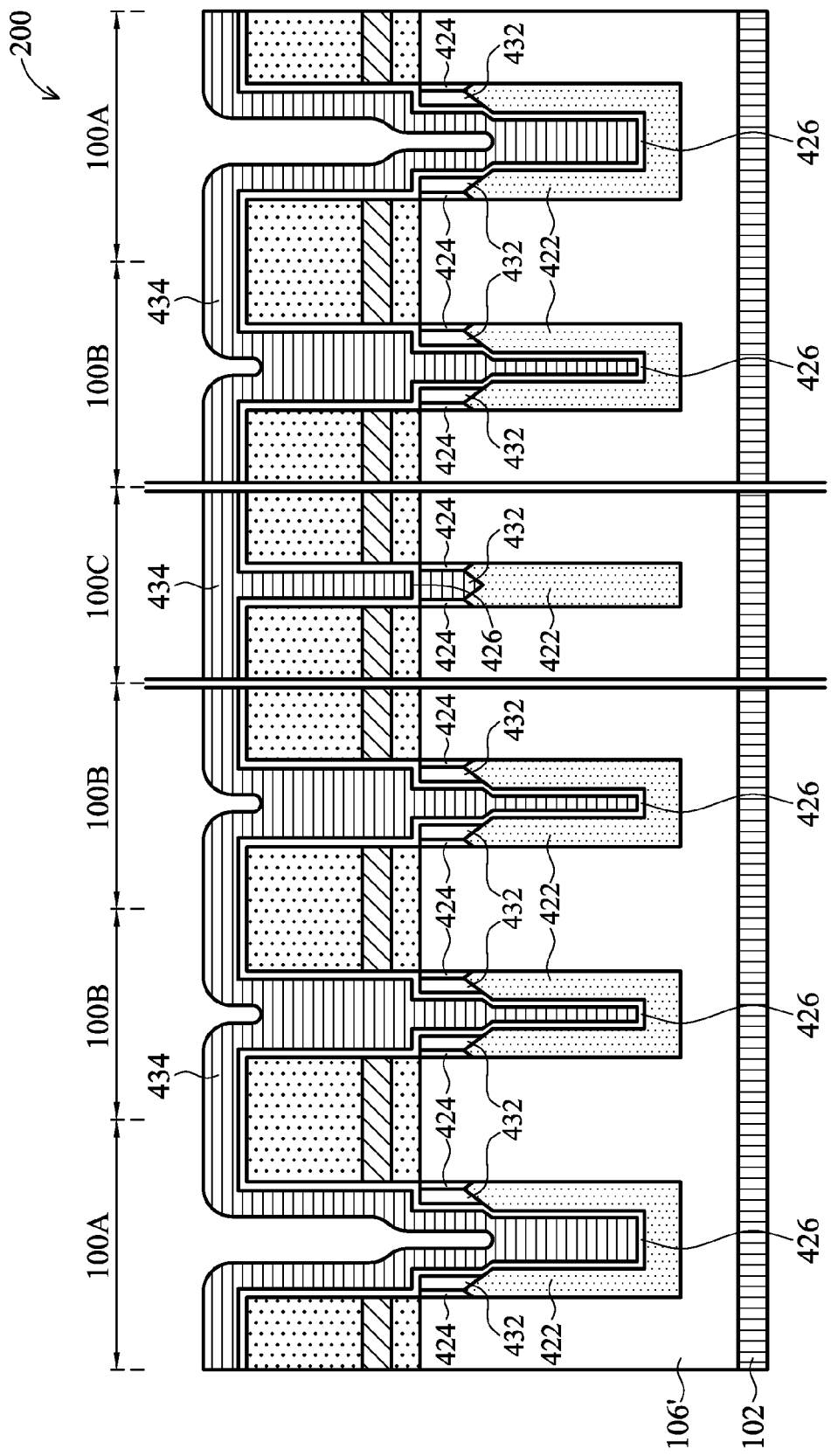

As depicted in FIG. 3 and FIG. 4D, in operation 340, a second conductive feature 434 is formed along sidewalls, an upper surface, and a bottom surface of the second insulating layer 426. In some embodiments, the second conductive feature 434 has a material including polycrystalline silicon, copper, aluminum, copper-aluminum alloy, tungsten, or other conductive materials. In some embodiments, the second conductive feature 434 has a thickness ranging from 500 nm to 550 nm.

Figure 4E:
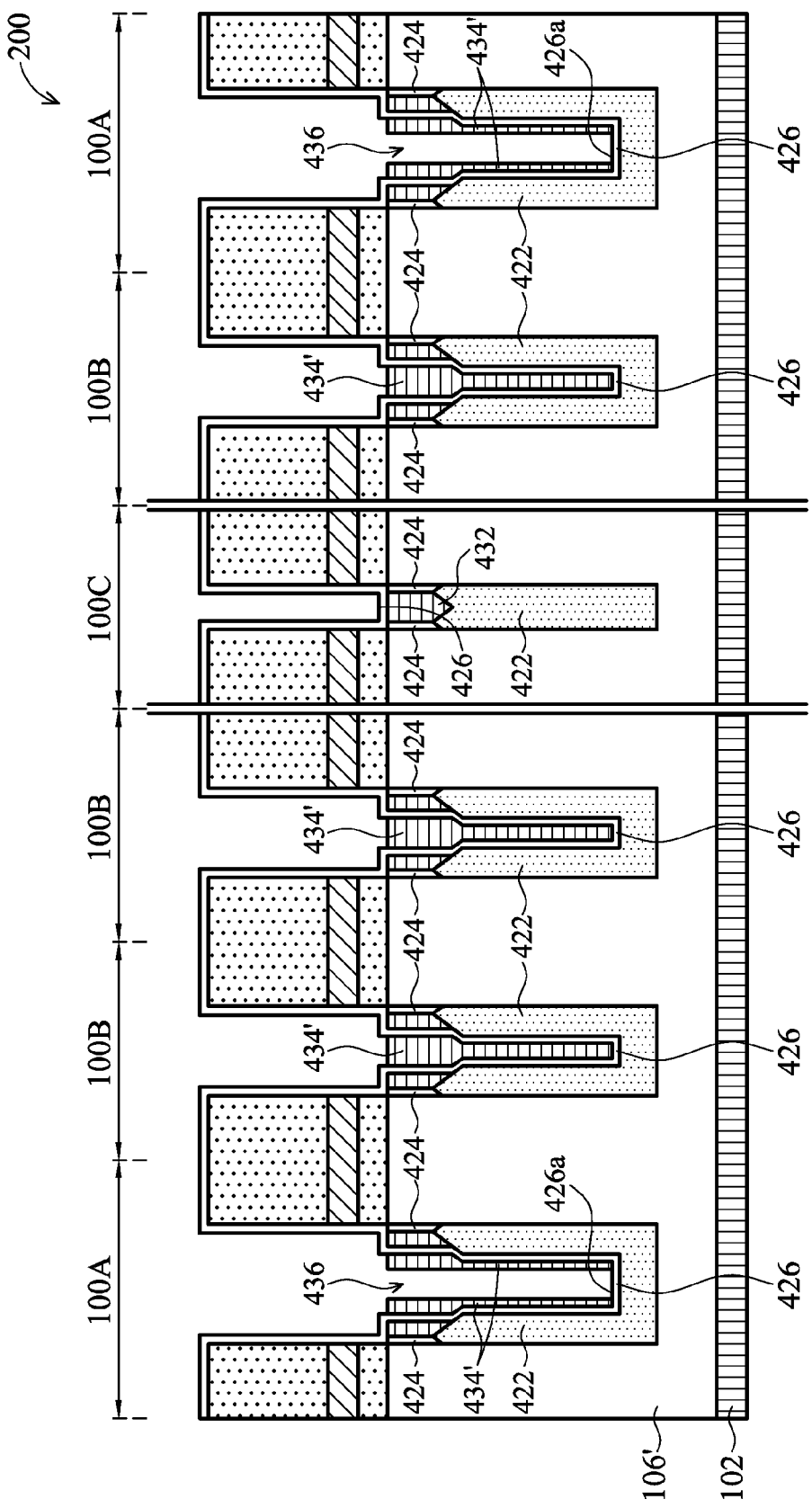

As depicted in FIG. 3 and FIG. 4E, in operation 350, a portion of the second conductive feature 434 is removed and resulting in a patterned second conductive feature 434'. In some embodiments for forming the vertical transistor cell 100C, the second conductive feature 434 above the second insulating layer 426 is removed. In some embodiments for forming the vertical transistor cell 100B, the second conductive feature 434 completely fills the trench 132. In some embodiments for forming the vertical transistor cell 100A, the second conductive feature 434 is selectively removed to define an opening 436 and reveal a portion of the bottom surface 426a of the second insulating layer 426. In some embodiments, the second conductive feature 434 is selectively removed by a dry etching process.

Figure 4F:
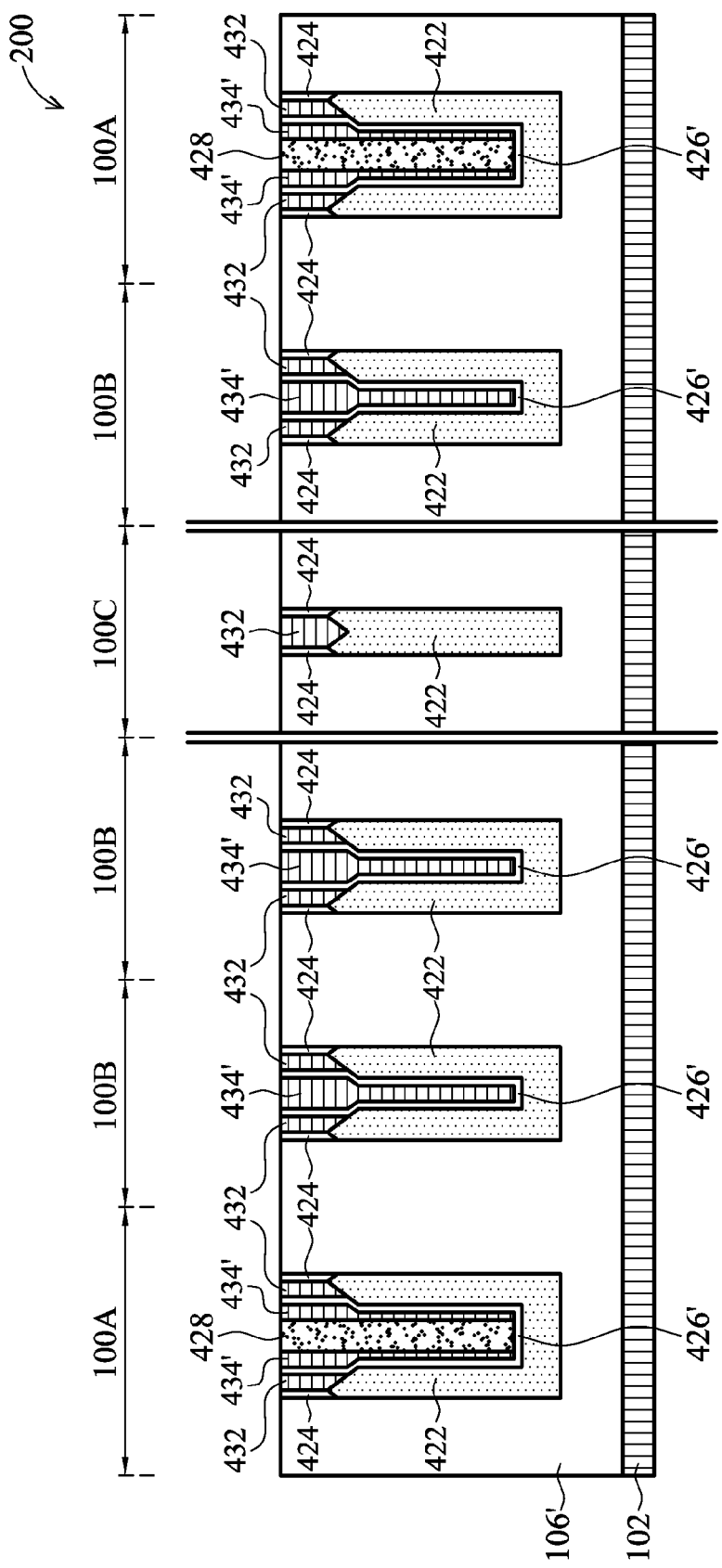

As depicted in FIG. 3 and FIG. 4F, in operation 360, a third insulating layer 428 is formed to fill the opening 436 and cover the patterned second conductive feature 434'. Then, a planarization process is performed to remove structures above an upper surface of the doped layer 106', including the first silicon dioxide layer 412, the first silicon nitride layer 414, and the second silicon dioxide layer 416.

Figure 4G:
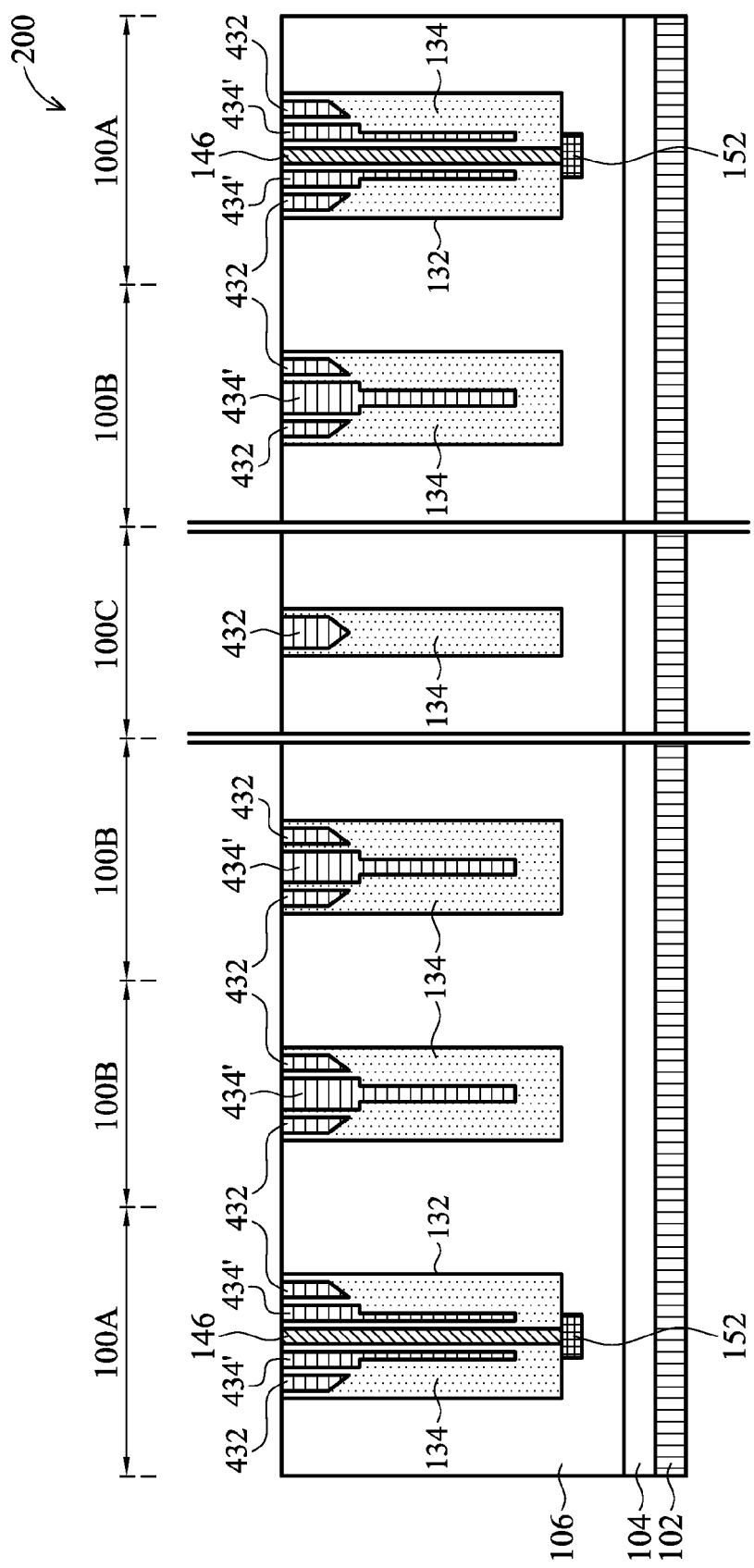

As depicted in FIG. 3 and FIG. 4G, in operation 372, a portion of the third insulating layer 428 is removed to form an opening (which is the space subsequently occupied by the third conductive feature 146) and to reveal a portion of the bottom surface of the trench 132 for forming the vertical transistor cell 100A. The first insulating layer 422, the gate dielectric structure 424, the remaining second insulating layer 426, and the remaining third insulating layer 428 are also collectively identified as the insulator 134 (FIG. 1A, 1B, or 1C).

As depicted in FIG. 3 and FIG. 4G, in operation 374, a portion of the doped layer 106' (FIG. 4F) underneath the revealed portion of the bottom surface of the trench 132 is converted into a region having the first type doping, such as an N-type doping. Then the doped layer 106' is processed to form the buried doped layer 104 (FIG. 1A, 1B, or 1C) over the substrate 102 and/or to form the doped layer 106 (FIG. 1A, 1B, or 1C) over the buried doped layer 104. In some embodiments, the buried doped layer 104 and the doped layer 106 have the first type doping. In some embodiments, conductivity of the region 152 is higher than that of the doped region 106. In some embodiments, conductivity of the buried doped layer 104 is higher than that of the doped region 106.

In some embodiments, the doped layer 106' has the second type doping, such as a P-type doping. In some embodiments, the doped layer 106 has the first type doping and is formed by performing an implantation process on the doped layer 106'. In some embodiments, the buried doped layer 104 is formed by performing a high-energy implantation after the formation of the doped layer 106' or after the formation of the doped layer 106.

In some embodiments, the buried doped layer 104 is formed by performing a low-energy implantation before epitaxially growing the doped layer 106'. In some embodiments, the doped layer 106' is formed over the buried doped layer 104 by an epitaxial process. In some embodiments, the doped layer 106' has the first type doping and acts as the doped layer 106.

As depicted in FIG. 3 and FIG. 4G, in operation 376, the third conductive feature 146 is formed to fill the opening in the third insulating layer 428 and in contact with the region 152. In some embodiments, the third conductive feature 146 has a material including polycrystalline silicon, copper, aluminum, copper-aluminum alloy, tungsten, or other conductive materials.

Figure 4H:
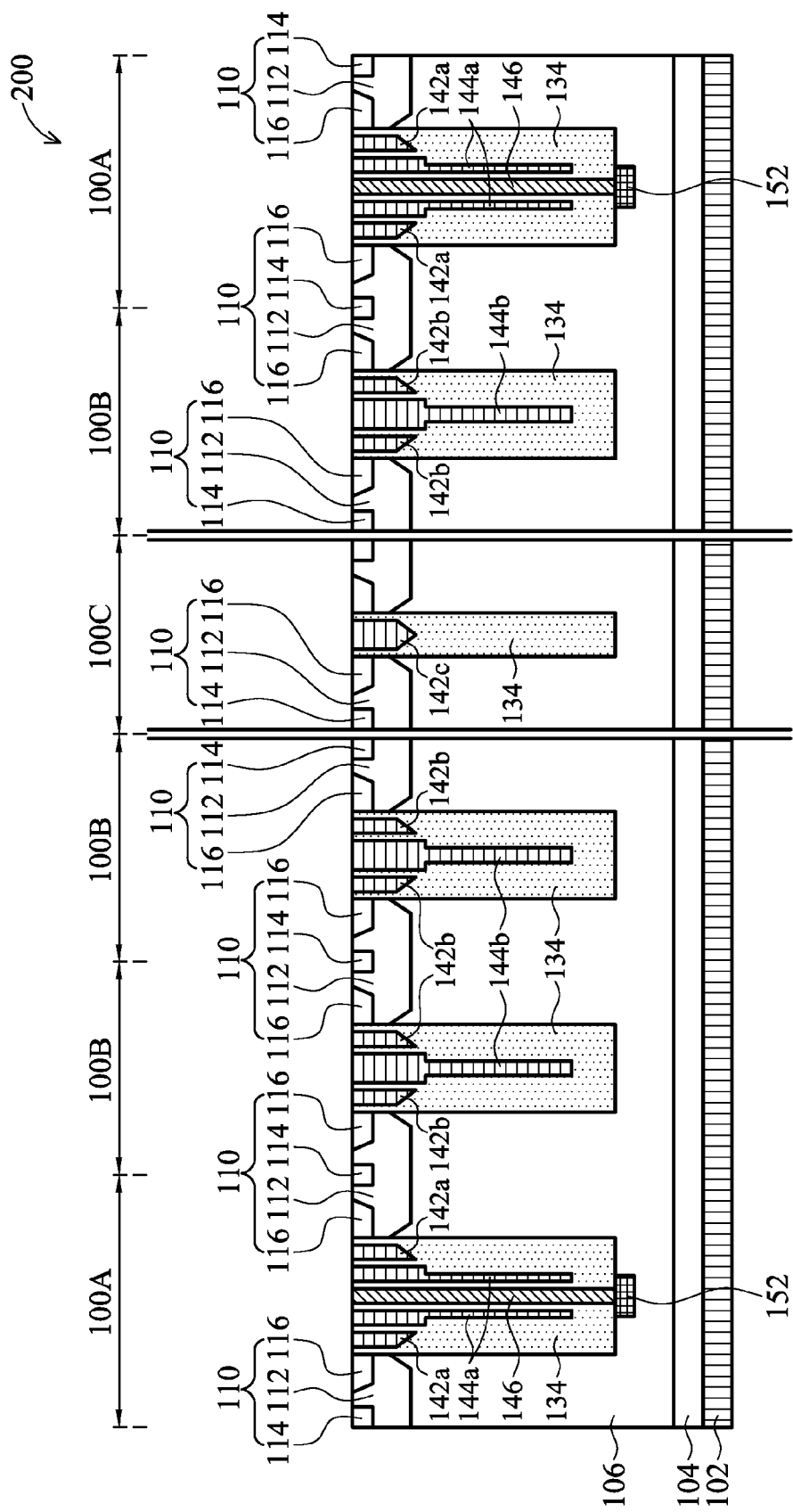

As depicted in FIG. 4H, the conductive features 432 for the vertical transistor cell 100A are usable as the first conductive features 142a in FIG. 1A; the conductive features 432 for the vertical transistor cell 100B are usable as the first conductive features 142b in FIG. 1B; and the conductive feature 432 for the vertical transistor cell 100C is usable as the first conductive feature 142c in FIG. 1C. The conductive features 434' for the vertical transistor cell 100A are usable as the second conductive features 144a in FIG. 1A; and the conductive features 434' for the vertical transistor cell 100B are usable as the second conductive features 142b in FIG. 1B.

As depicted in FIG. 3 and FIG. 4H, in operation 382, an upper portion of the doped layer 106 is converted into a body region 112 of a body structure 110. The remaining doped layer 106 below the body structure 100 has the first type doping, and the body region 112 has the second type doping. Then, in operation 384, a body contact region 114 is formed in the body structure 110. The body contact region 114 has the second type doping, and conductivity of the body contact region 114 is being greater than that of the body region 112. Then, in operation 386, the source region 116 is formed in the body structure 110, and the source region 116 has the first type doping.

Figure 4I:
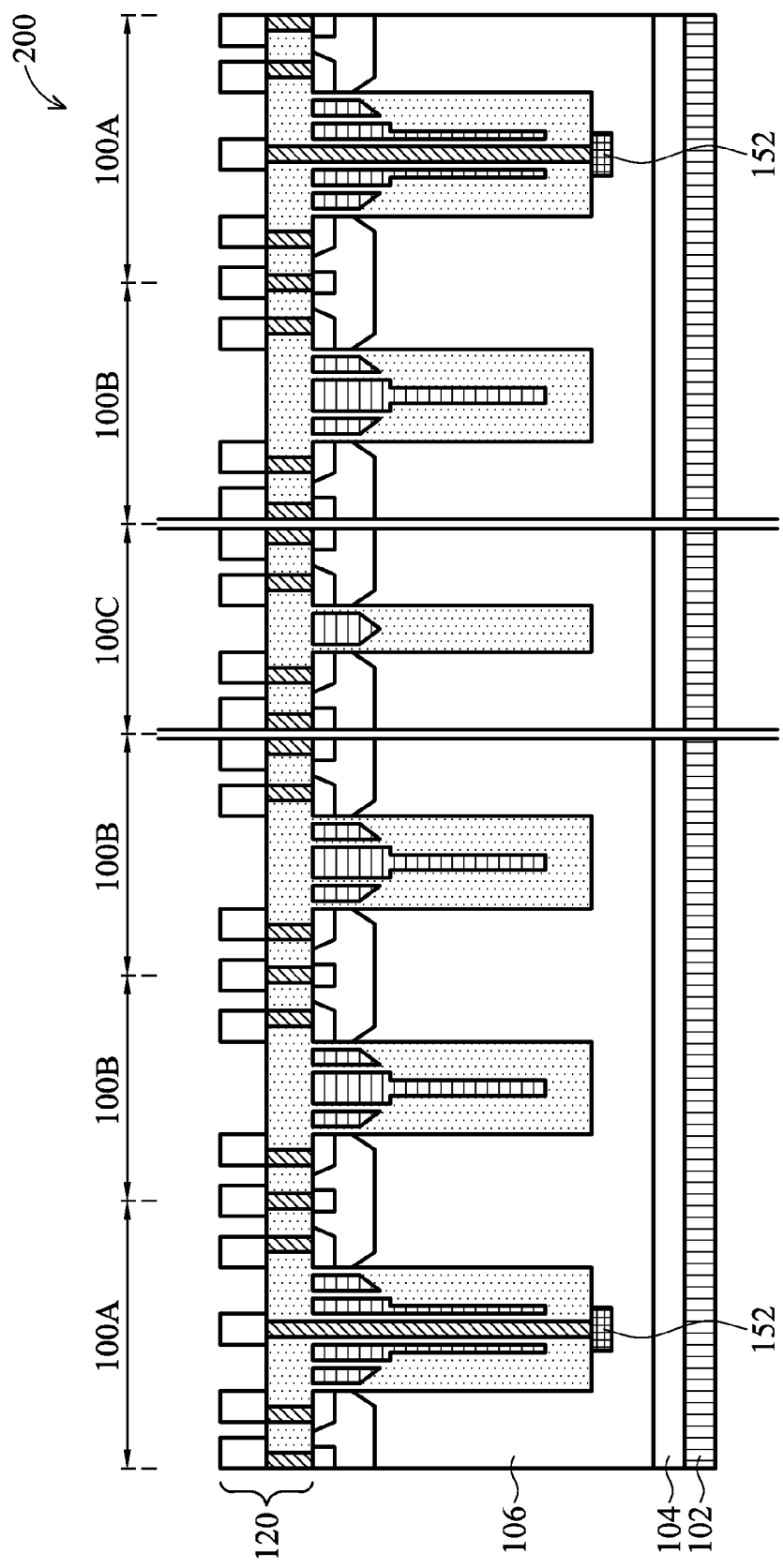

As depicted in FIG. 4I, after the operations in FIG. 4H, additional operations are performed to form the interconnection structure 120.

One aspect of this description relates to a method of forming a manufacture. The method includes forming a trench in a doped layer; and forming a gate dielectric layer along sidewalls of an upper portion of the trench. The method further includes forming a first conductive feature along sidewalls of the gate dielectric layer, wherein the first conductive feature has a first depth in the trench. The method further includes forming an insulating layer covering the first conductive feature. The method further includes forming a second conductive feature along sidewalls of the second insulating layer, wherein the second conductive feature has a second depth in the trench different from the first depth.

Another aspect of this description relates to a method of forming a manufacture. The method includes forming a trench in a doped layer; and forming a gate dielectric layer along sidewalls of an upper portion of the trench. The method further includes forming a first conductive feature along sidewalls of the gate dielectric layer. The method further includes forming a first insulating layer covering the first conductive feature. The method further includes forming a second conductive feature along sidewalls of the second insulating layer. The method further includes forming a second insulating layer within a first opening defined by the second conductive feature. The method further includes forming a third conductive feature within a second opening defined by the second insulating layer.

Still another aspect of this description relates to a transistor. The transistor includes a doped layer defining a plurality of trenches therein; and a plurality of transistor cells. Each transistor cell of the plurality of transistor cells in a corresponding trench of the plurality of trenches and includes an insulator partially filling the trench; and a gate electrode, wherein the gate electrode is separated from the doped layer by the insulator, and the gate electrode extends from a position substantially level with the upper surface of the trench toward a bottom surface of the trench. A first transistor cell of the plurality of transistor cells further comprises a source electrode, wherein the source electrode is separated from the gate electrode by the insulator, and the source electrode has an extended portion not overlapping the gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a manufacture, the method comprising:
   forming a trench in a doped layer;
   forming a gate dielectric layer along sidewalls of an upper portion of the trench;
   forming a first conductive feature along sidewalls of the gate dielectric layer, wherein the first conductive feature has a first depth in the trench;
   forming an insulating layer covering the first conductive feature; and
   forming a second conductive feature along sidewalls of the insulating layer, wherein the second conductive feature has a second depth in the trench different from the first depth, and the insulating layer is between the second conductive feature and a bottom of the trench.

2. The method of claim 1, wherein forming the second conductive feature comprises completely filling the trench.

3. The method of claim 1, further comprising selectively removing a portion of the second conductive feature in the trench.

4. The method of claim 1, further comprising implanting dopants into the doped layer to form a buried doped layer having a different dopant concentration or a different dopant type from a remaining portion of the doped layer.

5. The method of claim 4, wherein implanting dopants into the doped layer to form the buried doped layer is performed after forming the second conductive feature.

6. A method of forming a manufacture, the method comprising:
   forming a trench in a doped layer;
   forming a gate dielectric layer along sidewalls of an upper portion of the trench;
   forming a first conductive feature along sidewalls of the gate dielectric layer;
   forming a first insulating layer covering the first conductive feature;
   forming a second conductive feature along sidewalls of the first insulating layer;
   forming a second insulating layer within a first opening defined by the second conductive feature; and
   forming a third conductive feature within a second opening defined by the second insulating layer.

7. The method of claim 6, wherein forming the first insulating layer comprises forming the first insulating layer along a bottom surface of the trench.

8. The method of claim 7, wherein forming the second conductive feature comprises forming the second conductive feature in contact with the first insulating layer along the bottom surface of the trench.

9. The method of claim 6, further comprising removing a portion of the second insulating layer to expose a portion of the doped layer to form the second opening.

10. The method of claim 9, further comprising forming a contact region in the doped layer exposed by the second opening.

11. The method of claim 6, further comprising implanting dopants in the doped layer to change a dopant type of the doped layer from a first dopant type to a second dopant type.

12. A transistor comprising:
   a doped layer defining a plurality of trenches therein;
   a plurality of transistor cells, each transistor cell of the plurality of transistor cells in a corresponding trench of the plurality of trenches and comprising:
      an insulator partially filling the trench; and
      a gate electrode, wherein the gate electrode is separated from the doped layer by the insulator, and the gate electrode extends from a position substantially level with the upper surface of the trench toward a bottom surface of the trench,
   wherein a first transistor cell of the plurality of transistor cells further comprises a source electrode, wherein the source electrode is separated from the gate electrode by the insulator, and the source electrode has an extended portion not overlapping the gate electrode, and a top surface of the source electrode is substantially level with the upper surface of the trench.

13. The transistor of claim 12, wherein each transistor cell of the plurality of transistor cells comprises a contact region in the doped layer.

14. The transistor claim 13, wherein the contact region of the first transistor cell of the plurality of transistor cells is below the source electrode.

15. The transistor of claim 14, wherein the contract region of a second transistor cell of the plurality of transistor cells is adjacent a top surface of the doped layer.

16. The transistor of claim 12, wherein a width of the source electrode adjacent the upper surface of the trench is different from a width of the source electrode closest to the bottom surface of the trench.

17. The transistor of claim 12, wherein the first transistor cell of the plurality of transistor cells comprises a drain electrode, and the drain electrode is separated from the source electrode by the insulator, and a length of the drain electrode in the trench is greater than a length of the source electrode in the trench.

18. The transistor of claim 12, wherein the gate electrode of a second transistor cell of the plurality of transistor cells comprises a single conductive member.

19. The transistor of claim 12, further comprising a body structure in the doped layer between the first transistor cell of the plurality of transistor cells and a second transistor cell of the plurality of transistor cells.

20. The transistor of claim 19, wherein the gate electrode of the first transistor cell of the plurality of transistor cells overlaps with the body structure and extends beyond a bottom surface of the body structure.

* * * * *